(12) United States Patent
Shang et al.

(10) Patent No.: US 11,955,991 B2
(45) Date of Patent: Apr. 9, 2024

(54) APPARATUSES AND METHODS FOR PIPELINING MEMORY OPERATIONS WITH ERROR CORRECTION CODING

(71) Applicant: MICRON TECHNOLOGY, INC., Boise, ID (US)

(72) Inventors: Wei Bing Shang, Shanghai (CN); Yu Zhang, Shanghai (CN); Hong Wen Li, Shanghai (CN); Yu Peng Fan, Shanghai (CN); Zhong Lai Liu, Shanghai (CN); En Peng Gao, Shanghai (CN); Liang Zhang, Shanghai (CN)

(*) Notice: Subject to any disclaimer, the term of this patent is extended or adjusted under 35 U.S.C. 154(b) by 117 days.

(21) Appl. No.: 17/723,277

(22) Filed: Apr. 18, 2022

(65) Prior Publication Data

US 2022/0247430 A1      Aug. 4, 2022

Related U.S. Application Data

(62) Division of application No. 16/593,479, filed on Oct. 4, 2019, now Pat. No. 11,309,919, which is a division
(Continued)

(51) Int. Cl.
*H03M 13/45* (2006.01)
*G06F 9/00* (2006.01)
(Continued)

(52) U.S. Cl.
CPC ............ *H03M 13/45* (2013.01); *G06F 9/38* (2013.01); *G06F 11/1048* (2013.01); *H03M 13/611* (2013.01)

(58) Field of Classification Search
CPC ............ H03M 13/45; H03M 13/6561; H03M 13/2942; H03M 13/611; G06F 11/1048;
(Continued)

(56) References Cited

U.S. PATENT DOCUMENTS 5,687,353 A    11/1997  Chen et al.
6,643,194 B2   11/2003  Ryan et al.
(Continued)

FOREIGN PATENT DOCUMENTS

| CN | 102483955 A | 5/2012 |
| CN | 102566982 A | 7/2012 |
| CN | 103279401 A | 9/2013 |

OTHER PUBLICATIONS

English Translation of First Office Action dated Aug. 10, 2018, for Chinese Application No. 201480084090.5.
(Continued)

*Primary Examiner* — Justin R Knapp

(57) ABSTRACT

Apparatuses and methods for pipelining memory operations with error correction coding are disclosed. A method for pipelining consecutive write mask operations is disclosed wherein a second read operation of a second write mask operation occurs during error correction code calculation of a first write mask operation. The method may further including writing data from the first write mask operation during the error correction code calculation of the second write mask operation. A method for pipelining consecutive operations is disclosed where a first read operation may be cancelled if the first operation is not a write mask operation. An apparatus including a memory having separate global read and write input-output lines is disclosed.

11 Claims, 7 Drawing Sheets

Related U.S. Application Data of application No. 14/423,343, filed as application No. PCT/CN2014/009433 on Dec. 19, 2014, now Pat. No. 10,447,316.

(51) Int. Cl.
*G06F 9/38* (2018.01)
*G06F 11/10* (2006.01)
*H03M 13/00* (2006.01)

(58) Field of Classification Search
CPC .... G06F 11/1076; G06F 3/064; G06F 3/0619; G06F 3/0673; G06F 9/38; G11C 29/42; G11C 2029/0411
See application file for complete search history.

(56) References Cited

U.S. PATENT DOCUMENTS

| | | |
|---|---|---|
| 6,976,204 B1 | 12/2005 | Chambers et al. |
| 7,043,679 B1 | 5/2006 | Keltcher et al. |
| 7,830,726 B2 | 11/2010 | Huang et al. |
| 7,945,840 B2 | 5/2011 | Schreck et al. |
| 8,127,205 B2 | 2/2012 | Hirano et al. |
| 8,321,761 B1 | 11/2012 | Gruner et al. |
| 9,148,176 B2 * | 9/2015 | Zhang ................. G06F 11/1048 |
| 9,703,633 B2 * | 7/2017 | Zhang ............... H03M 13/2942 |
| 10,013,352 B2 | 7/2018 | Subramoney et al. |
| 2004/0003174 A1 | 1/2004 | Yamazaki |
| 2004/0264279 A1 | 12/2004 | Wordenman et al. |
| 2008/0163029 A1 | 7/2008 | Hirano et al. |
| 2008/0195894 A1 | 8/2008 | Schreck et al. |
| 2009/0006905 A1 | 1/2009 | Luick |
| 2009/0276609 A1 | 11/2009 | Moyer et al. |
| 2012/0198161 A1 | 8/2012 | Chachad et al. |
| 2014/0289556 A1 | 9/2014 | Sano et al. |
| 2015/0089316 A1 * | 3/2015 | Zhang ............... H03M 13/6561 714/755 |

OTHER PUBLICATIONS

English translation of First Office Action received for KR Application No. 10-2017-7019620, dated Nov. 19, 2018.
Received ISRWO dated Aug. 4, 2015 for PCT/CN2014/094330.

* cited by examiner

APPARATUSES AND METHODS FOR PIPELINING MEMORY OPERATIONS WITH ERROR CORRECTION CODING

CROSS-REFERENCE TO RELATED APPLICATION (S)

This application is a divisional of U.S. patent application Ser. No. 16/593,479, filed Oct. 4, 2019, issued as U.S. Pat. No. 11,309,919 on Apr. 19, 2022, which is a divisional of U.S. patent application Ser. No. 14/423,343 filed Feb. 23, 2015, issued as U.S. Pat. No. 10,447,316 on Oct. 15, 2019, which is a 371 National Stage application claiming priority to International Application No. PCT/CN2014/094330 filed Dec. 19, 2014. These applications and patents are incorporated by reference herein in their entirety and for all purposes.

BACKGROUND

Feature sizes of semiconductor memory have been reduced to produce smaller memory components and/or provide more memory capacity in the same area. Voltage levels provided to semiconductor memory have also been reduced to limit power consumption. As the size and/or voltage of memory cells are reduced, the level of charge stored in each memory cell may also be reduced. This decreases margin of error of detecting the data state of the memory cells based on the stored charge. The reduced margin of error may make a memory device more prone to soft errors, for example, alpha particle interaction. The memory device may also be prone to other errors due to weak cells such as variable refresh times (VRT). An error may occur when one or more memory cells lose the charge stored in the cell before the cell is refreshed during a regular memory refresh cycle. The cell may lose its charge at an abnormal rate due to high leakage currents, poor initial charging, and/or additional defects in the cell. These errors may cause random single bit errors in the memory device.

Error correction code (ECC) may be used with the memory to compensate for and/or correct data errors in the memory cells. Examples of ECC include Hamming codes and parity bits. While ECC may improve data integrity of the memory, it may also increase the time required for one or more memory operations. This may reduce memory performance.

SUMMARY OF THE INVENTION

According to an embodiment of the disclosure, an apparatus may include a memory array, including a plurality of memory cells, a write driver coupled to the memory array by a global write I/O line, wherein the write driver may be configured to provide data to the plurality of memory cells, a data sense amplifier coupled to the memory array by a global read I/O line, wherein the data sense amplifier may be configured to receive data stored in the plurality of memory cells, an error control code circuit coupled to the write driver by a local write data line and further coupled to the data sense amplifier by a local read data line, wherein the error control code circuit may be configured to receive data from a global write data line and send data via a global read data line, and a control circuit that may be configured to provide control signals to the memory array, write driver, data sense amplifier, and error control circuit, wherein the control circuit may be further configured to detect two consecutive write mask operations and pipeline execution of the two consecutive write mask operations, wherein a second write mask operation of the two consecutive write mask operations may begin execution before a first write mask operation of the two consecutive write mask operations completes execution.

According to an embodiment of the disclosure, a method may include executing a first read operation in a memory to read first read data; comparing error correction code for first read data to determine errors in the first read data; correcting errors in the first read data; pre-charging a local input-output line after the first read operation has executed; executing a second read operation in the memory to read second read data during the comparing of the error correction code for the first read data; merging the first read data with first write data to be written in the memory to provide first merged data; calculating a first new error correction code for the first merged data; executing a first write operation to write the first merged data in the memory; comparing error correction code for second read data to determine errors in the data read from the second address during the merging of the first read data with the first write data; correcting errors in the second read data; merging the second read data with second write data to be written in the memory to provide merged data; calculating a second new error correction code for the second merged data; and executing a second write operation to write the second merged data in the memory.

According to an embodiment of the disclosure, a method may include receiving a first data signal at the memory; reading first read data from a first address in the memory; calculating an error correction code for the first read data; merging data from the first data signal with the first read data to generate first new data; calculating an error correction code for the first new data; receiving a second data signal at the memory; reading second read data from a second address in the memory during the calculating of the error correction code for the first new data; calculating an error correction code for the second read data; merging data from the second data signal with the second read data to generate second new data; calculating an error correction code for the second new data; writing the first new data to the first address in the memory; and writing the second new data to the second address in the memory.

According to an embodiment of the disclosure, a method may include receiving a first write command at a memory; receiving a second write command at the memory; receiving a first data signal at the memory; receiving a first mask data signal at the memory; executing a first read operation at a first address in the memory after the first data signal and the first mask data signal have been received; calculating error correction code for data read from the first address; merging data from the first data signal with the data read from the first address to generate first new data; calculating error correction code for the first new data; receiving a second data signal at the memory; receiving a second mask data signal at the memory; executing a second read operation at a second address in the memory; calculating error correction code for data read from the second address; merging data from the second data signal with the data read from the second address to generate second new data; calculating error correction code for the second new data; executing a first write operation at the first address to store the first new data; and executing a second write operation at the second address to store the second new data.

DETAILED DESCRIPTION OF PREFERRED EMBODIMENTS

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

A memory with error correction code (ECC) may be capable of executing one or more operations. Operations may include read, write, write mask, and/or erase. Other operations may also be included. A read operation may provide data stored in an array included in the memory to a device external to the memory and/or another component within the memory. A write operation may write data to the array. The data may be received from a device external to the memory and/or another component within the memory. A write mask operation may write data to a portion of the array while preventing one or more other portions of the array from being written to. For example, a write mask operation may be performed in response to writing data that is smaller in size than the minimum writable data unit of the array in the memory. In some memory embodiments, the write mask operation may have the longest column-to-column delay (tCCD) of the memory operations executed by the memory. The write mask operation may include a read-modify-write operation to ensure only the desired bits are rewritten. That is, the write mask operation may read data from the array, modify the data read from the array, and write the modified data to the array. In some embodiments, the modified data may include new data received by the memory, data generated by a component of the memory (e.g., ECC code), data previously written to the array, and/or a combination thereof. In some cases, the length of the tCCD of the write mask operation may decrease memory performance.

Figure 1:
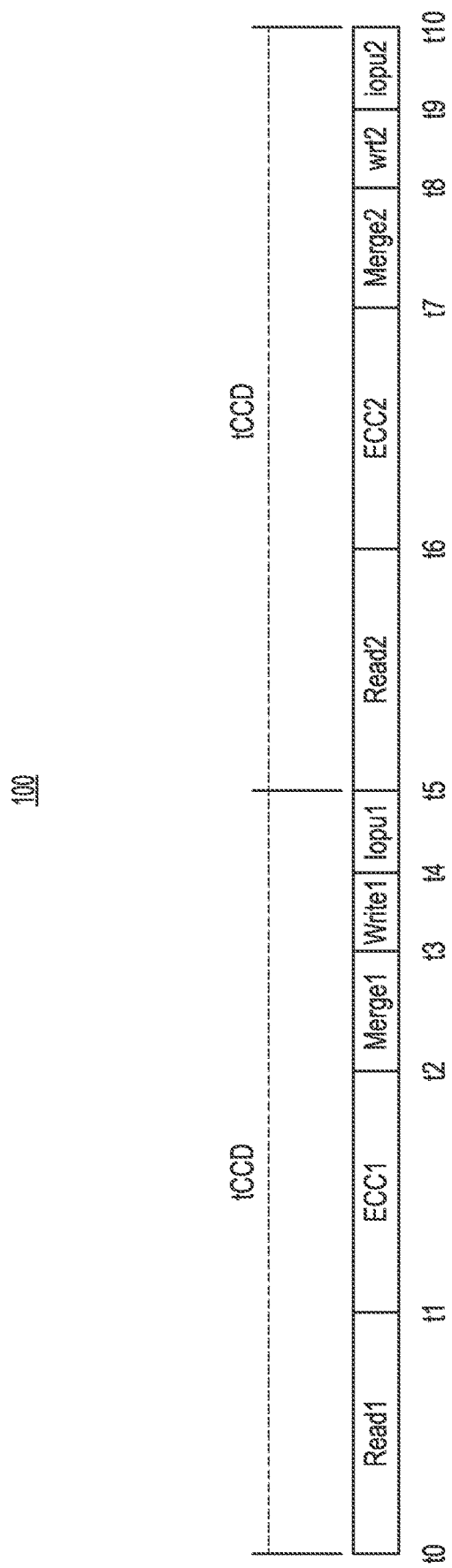
FIG. 1 is a simplified timing diagram of two write mask operations according to an embodiment of the disclosure.

An example of two consecutive write mask operations according to embodiments of the disclosure is illustrated in a simplified timing diagram 100 in FIG. 1. When a write mask operation is initiated, at time t0 and during Read1, data is read from memory of the array corresponding to the memory address. After the memory at the address is read, at time t1, the ECC of the read data is compared, and if necessary, errors are corrected during ECC1. Single bit errors and/or multi-bit errors may be corrected. At time t2, the new data to be written is merged with the read data, and new ECC is calculated during Merge1. The merged data and new ECC are then written during Write1 to the desired memory location or locations in the memory array at time t3. In some embodiments, the merged data is written to the same memory from which the read data was read, that is, to the memory corresponding to the memory address. Before the next operation, local input/output lines (LIOs) may be pre-charged at time t4 in preparation for a subsequent memory operation. The LIOs may be used to provide the read data from the memory to other internal memory circuit, for example, data amplifiers. The elapsed time from time t0 to time t5 may represent tCCD. A second write mask operation identical to the first then begins execution at time t5 and completes at time t10.

It may be possible to reduce the tCCD for two consecutive write mask operations by utilizing pipelining of operations. Pipelining of operations for execution may include executing an operation before a previous operation has completed executing. In some embodiments of pipelining operations, two or more operations may be executed concurrently by the memory. In some embodiments of pipelining of operations, two or more instructions being executed by the memory may both be in stages of execution during a period of time.

Figure 2:
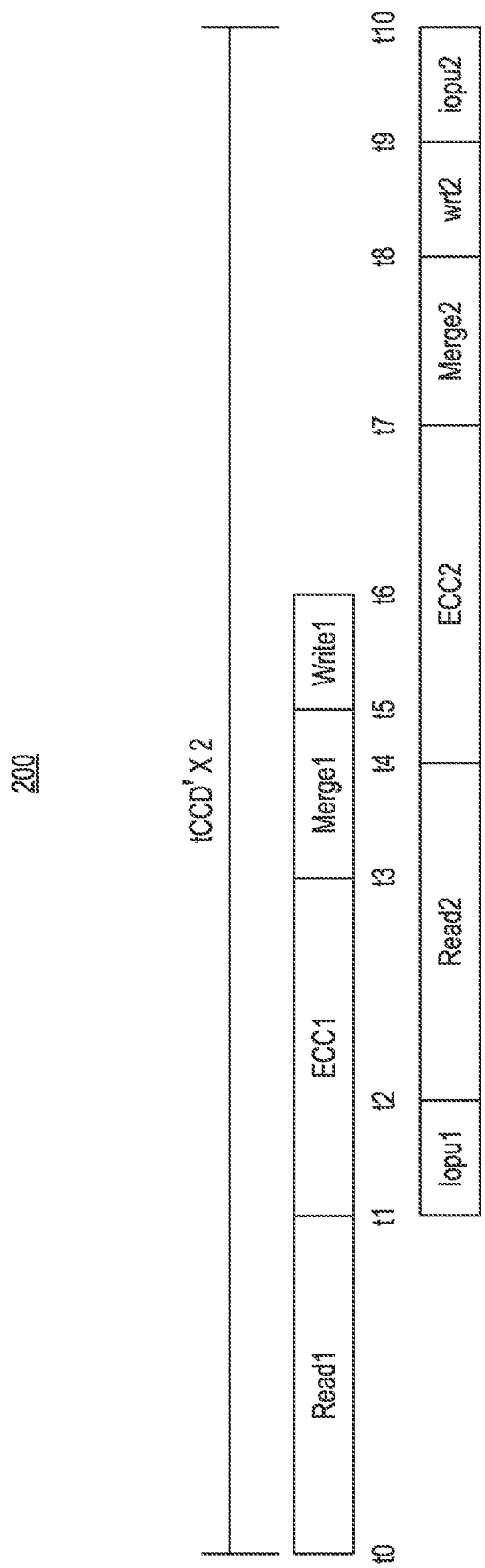
FIG. 2 is a simplified timing diagram of two pipelined write mask operations according to an embodiment of the disclosure.

FIG. 2 illustrates a simplified timing diagram 200 of an example pipelined execution of two write mask operations according to embodiments of the disclosure. At time t0, memory corresponding to the memory address is accessed and data is read during Read1. After the data is read, at time t1, the ECC of the read data is compared, and if necessary, errors are corrected during ECC1. In contrast to timing diagram 100, at time t1 following the completion of Read1, the LIO is also pre-charged during Iopu1. Pre-charge of the LIO occurs during ECC1, that is, during the ECC operation for the first address. Memory corresponding to a second address of the second write mask operation is accessed and data is read during Read2 at time t2. Read2 overlaps (e.g., at least a portion of which occurs concurrently) ECC1, during which, as previously described, the ECC of the read data is compared and errors are corrected, in necessary. At time t3, new data to be written to the first memory address is merged with the read data for the first memory address, and new ECC is calculated during Merge1. At time t4, the ECC of the second read data is compared, and if necessary, errors are corrected during ECC2. The merged data and new ECC of the first address are written to the desired memory location in the memory array at time t5 and during Write1. The first write mask operation completes execution at time t6. At time t7, the new data to be written to the second address is merged with the read data for the second address, and new ECC is calculated during Merge2. The merged data and new ECC of the second address are written to the desired memory location in the memory array at t8 and during Write2. The LIO is pre-charged at t9 during iopu2 in preparation for a subsequent memory operation, and the second write mask operation completes execution at time t10. The total execution time for the two pipelined write mask operations as shown in timing diagram 200 may be less than the time for two consecutively executed write mask operations as shown in timing diagram 100. Although two consecutive write mask operations are pipelined in FIG. 2, it may be possible to pipeline more than two consecutive write mask operations. For example, a third write mask operation may begin at time t4 following Read2 in timing diagram 200.

Figure 5:
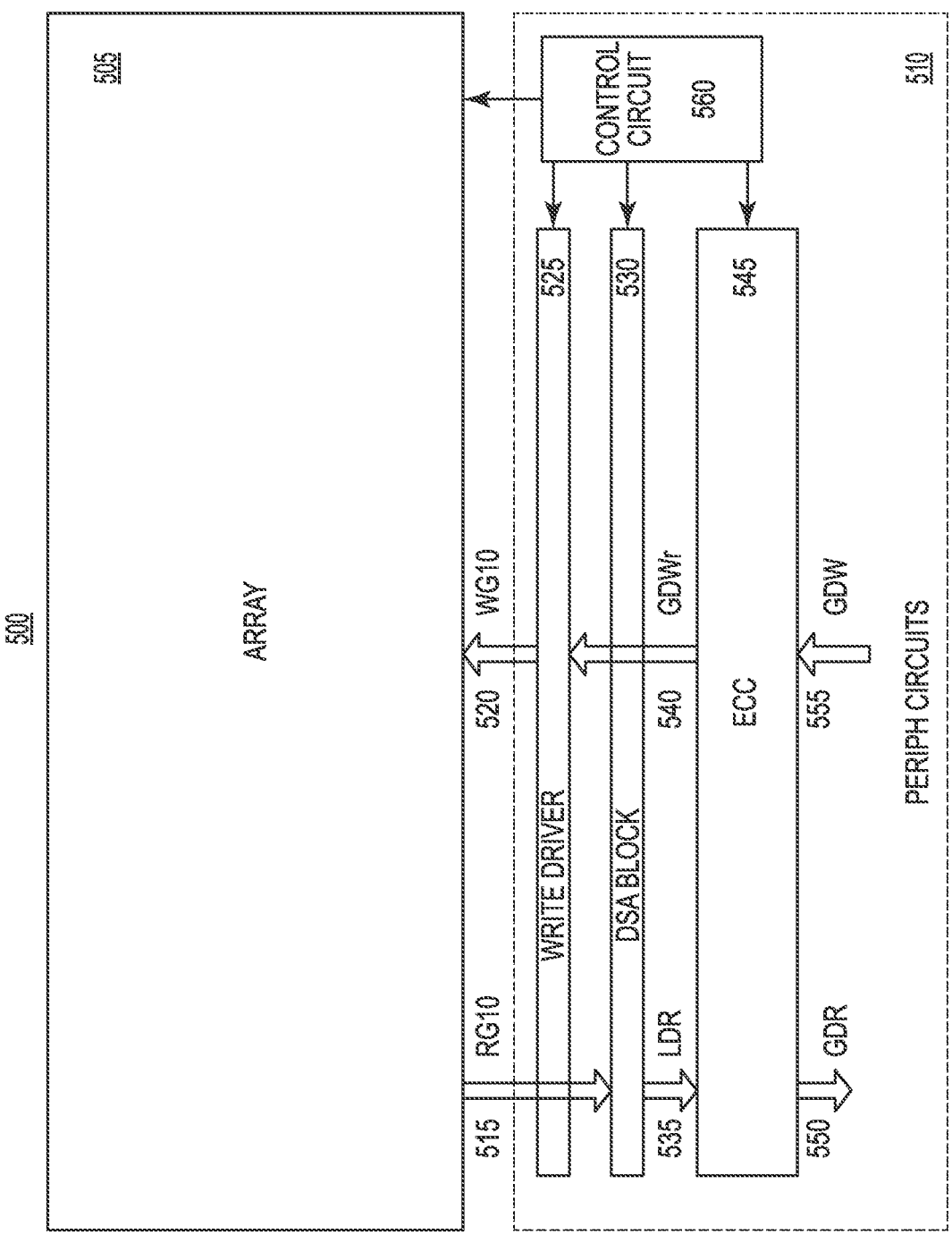
FIG. 5 is a block diagram of a memory according to an embodiment of the disclosure.

FIG. 5 illustrates a memory 500 according to one or more embodiments of the disclosure. The memory 500 may be capable of performing the pipelined write mask operations as described in reference to FIG. 2. The memory 500 may include an array 505 and peripheral circuits 510 coupled to the array 505. The array 505 may include a plurality of memory cells, which may be organized into a plurality of rows and columns. The peripheral circuits 510 may include a write driver 525. When enabled, the write driver 525 may overdrive sense amplifiers selected by a column address decoder (not shown in FIG. 5) and provide data to be written to the array 505 via a global write I/O line 520. In some embodiments, the data to be written to the array 505 may include parity bits and/or other ECC. The peripheral circuits 510 may also include error correction code (ECC) circuit 545. During a write operation, the ECC circuit 545 may receive data to be written to the array 505 from the data I/O line (not shown in FIG. 5) via a global write data line 555. The ECC circuit 545 may calculate parity bits or other ECC for the data to be written to the array 505. The ECC circuit may then provide the data to be written to the array 505 to the write driver 525 via a local write data line 540.

The peripheral circuits 510 may further include a data sense amplifier (DSA) 530 for amplifying and providing data read from the array 505 and provided by global read I/O line 515. In some embodiments, the data read from the array 505 may include parity bits and/or other ECC. The ECC circuit 545 may receive data read from the array 505 from local read data line 535. The ECC circuit 545 may check read data for errors and correct errors that may be found. During a read operation, the ECC circuit 545 may then pass the corrected read data to the data I/O line (not shown in FIG. 5) via a global read data line 550.

During a write mask operation, the ECC circuit 545 may also receive a mask data signal from the data I/O line via the global write data line 555. The ECC circuit 545 may receive the data read from the array 505 at the address corresponding to where the received data is to be written from the local read line 535. The ECC circuit 545 may check the read data for errors and correct errors that may be found. The ECC circuit 545 may then merge the corrected read data with the received data to be written to the array 505. The ECC circuit 545 may further calculate new parity bits or other ECC for the merged data. The merged data may be passed by the ECC circuit 545 to the write driver 525 via the local write line 540. The ECC circuit 545 may also pass parity bits and/or other ECC to the write driver 525. The write driver 525 may then provide the data to be written to the array 505 via global write I/O line 520.

Figure 7:
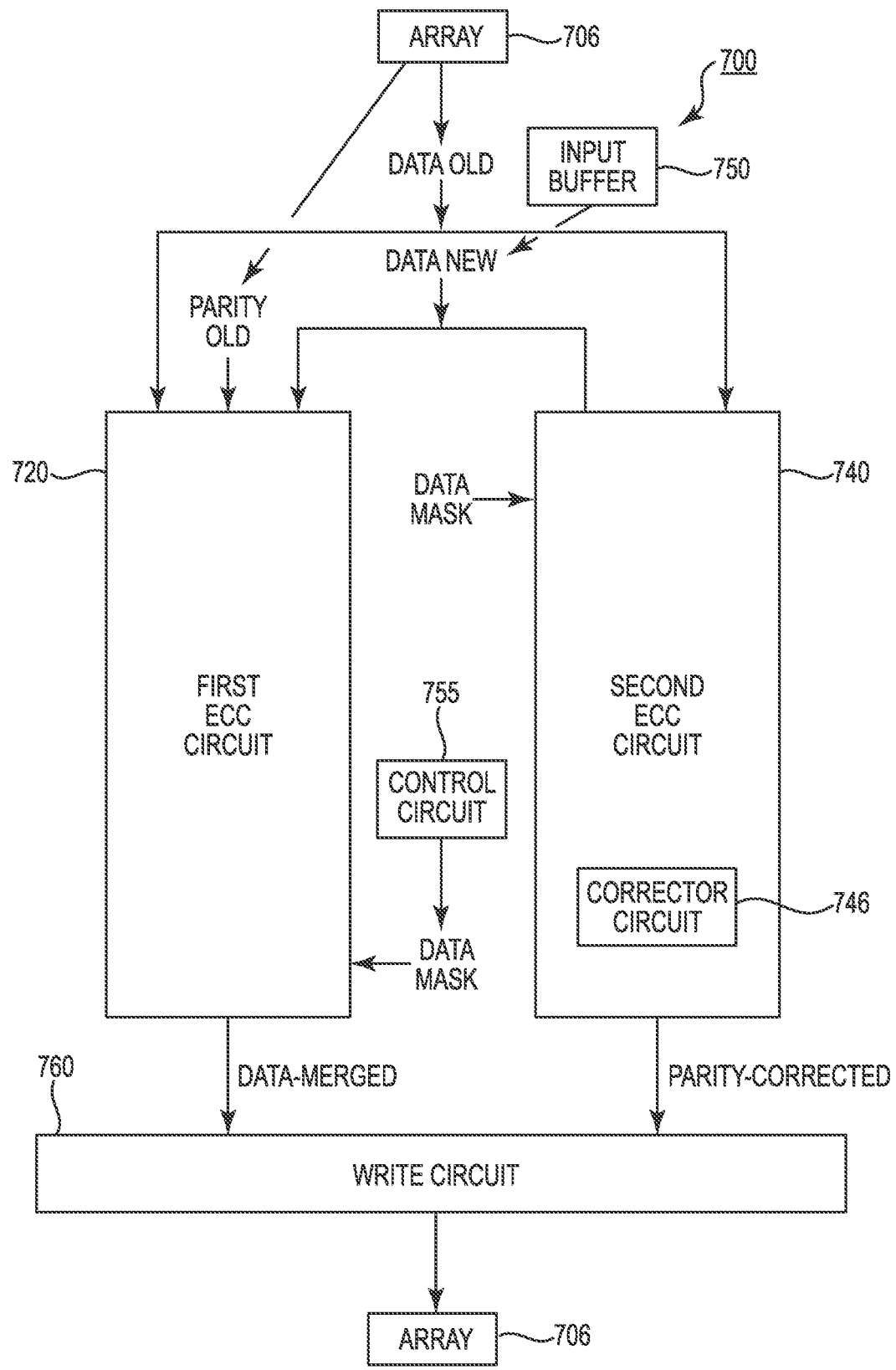
FIG. 7 is a block diagram of a parallel ECC circuit according to an embodiment of the disclosure.

In some embodiments, the ECC circuit 545 may be implemented as two ECC circuits operating in parallel. FIG. 7 is a block diagram of a parallel ECC circuit according to an embodiment of the invention. FIG. 7 illustrates an example configuration of two ECC circuits configured to operate in parallel 700, according to an embodiment of the invention. The parallel ECC circuit 700 may be coupled to an array 706 of volatile or non-volatile memory. The array 706 may be similar to the array 505 shown in FIG. 5.

The parallel ECC circuit 700 may include a first ECC circuit 720 and a second ECC circuit 740 that may generally operate in parallel. The first ECC circuit 720 may receive first data DATA-OLD and parity bits PARITY-OLD associated with the first data DATA-OLD. The first data DATA-OLD may be old data previously stored and read out from the array 706. The first ECC circuit 720 may also receive a second data DATA-NEW, which may be new data, of which at least some portions are to be stored in the array 706 in place of respective portions of the first data DATA-OLD (e.g., at least some portions of the second data DATA-NEW are to overwrite respective portions of the first data DATA-OLD). DATA-NEW may be received by the first ECC circuit 720 via an input buffer 760, not the array 706. In some embodiments, the input buffer may receive DATA-NEW from a device (not shown) external to the memory.

The first ECC circuit 720 is configured to selectively correct one or more data errors in the first data DATA-OLD based on the first data DATA-OLD and its associated parity bits PARITY-OLD when one or more data errors are detected in the first data DATA-OLD. The corrected data may correspond to the data word that was supposed to have been stored in the array 706. During operation of the parallel ECC circuit 700, the first data DATA-OLD provided to the first ECC circuit 720 may not always have one or more data errors. It will be understood that, although the first ECC circuit 720 is configured to correct one or more data errors in the data DATA-OLD provided to it when such errors are detected by the first ECC circuit 720, when a data DATA-OLD provided to the first ECC circuit 720 does not have any data errors, the first ECC circuit 720 will not "correct" the data bits in the data word, as there are no errors to correct.

The first ECC circuit 720 is configured to selectively merge the corrected data (i.e., the first as corrected by the first ECC circuit or the uncorrected first data word if no data errors were detected in the same) with the second data DATA-NEW responsive to a control signal, such as a write mask signal DATAMASK. The DATAMASK signal may be received from a control circuit 755. The control circuit 755 may be similar to control circuit 560 shown in FIG. 5. The first ECC circuit 720 may generate a final merged data DATA-MERGED based on one or more portions of the corrected data word and one or more portions of the second data DATA-NEW, with the control signal DATAMASK determining which portions of which data are used to generate the final merged data DATA-MERGED. In other words, the control signal DATAMASK may cause the first ECC circuit 720 to retain one or more portions of the corrected data from being replaced by one or more corresponding portions of the second data DATA-NEW during a write mask operation.

The first ECC circuit 720 may provide the final merged data DATA-MERGED to a write circuit 760, which may subsequently write the final merged data DATA-MERGED to the array 706 together with associated parity bits PARITY-CORRECTED, as described in more detail below. In some embodiments, the write circuit 760 may be implemented to include write driver 525 as shown in FIG. 5.

The second ECC circuit 740 may be separate and distinct from the first ECC circuit 720 in some embodiments, and may operate at least partially contemporaneously with the first ECC circuit 720. In other words, the time during which the second ECC circuit 740 operates as described herein may at least partially overlap the time during which the first ECC circuit 720 operates as described herein—e.g., such that one of the circuits 720, 740 begins its respective operation(s) before the other of the circuits 720, 740 has finished its respective operation(s). This parallel operation of the first and second ECC circuits 720, 740 may in some examples improve the timing of reading from and/or writing to the array 706 as compared to an apparatus in which the operations of similar first and second ECC circuits operate in series in that the second ECC circuit does not begin operation until the first ECC circuit has completed operations.

The second ECC circuit 740 receives the first data DATA-OLD and the second data DATA-NEW, but does not receive the corrected first data from the first ECC circuit 720. The second ECC circuit 740 preliminarily merges the first data DATA-OLD and the second data DATA-NEW responsive to the control signal DATAMASK and thereby generates an initial merged data word. The control signal DATAMASK provided to the first ECC circuit 720 is generally the same as the control signal DATAMASK provided to the second ECC circuit 740. The result of the preliminary merge is an "initial" merged data because any portions of the first data DATA-OLD that are merged into the initial merged data may include one or more data errors because the input to the second ECC circuit 740 is "raw" data words DATA-OLD from the array 706 that may include one or more data errors.

The second ECC circuit 740 also generates initial parity bits associated with the initial merged data, and corrects the initial parity in a corrector circuit 746. The corrected parity bits PARITY-CORRECTED is provided by the second ECC circuit 740 to the write circuit 760, which, as mentioned above, writes the corrected parity bits PARITY-CORRECTED to the array 706 together with the final merged data DATA-MERGED. The corrected parity code may be representative of the entire final merged data DATA-MERGED in some examples, or in other examples may be representative of two or more portions (e.g., with each portion corresponding to a section of the data that may be masked) of the final merged data DATA-MERGED.

The initial parity bits may need to be corrected because it was generated based on the initial merged data, which may contain one or more data errors. If the initial merged data contains one or more errors, as compared to the final merged data DATA-MERGED generated by the first ECC circuit 720, the initial parity bits generated from the initial merged data will have one or more errors as compared to what the parity bits for the final merged data DATA-MERGED should have. In other words, the second ECC circuit 740 corrects the initial parity bits such that the corrected parity bits PARITY-CORRECTED are the parity bits for the final merged data DATA-MERGED. As described in more detail below, in those instances where there are no data errors in the portions of the first data DATA-OLD that are merged into the final merged data DATA-MERGED, the initial parity bits will not need to be corrected, and will simply be passed through the corrector circuit 746 as the corrected parity bits PARITY-CORRECTED.

Operating the first and second ECC circuits 720, 740 in parallel allows the first parity circuit 720 to correct a data error(s) in the first data DATA-OLD while at least partially contemporaneously allowing the second ECC circuit 740 to generate the initial parity bits as if there were no errors in the portions of the first data DATA-OLD that are merged into the final data DATA-MERGED. Because these two operations are relatively lengthy, and the correction of the initial parity bits is relatively quick, the read-modify-write of the write mask operation can be more quickly and efficiently processed than in a sequential ECC decode and subsequent ECC encode procedure.

Examples of parallel ECC circuits that may be used to implement parallel ECC circuit 700 are described in U.S. application Ser. No. 14/002,092, "Circuits, apparatuses, and methods for correcting data errors," filed on Aug. 28, 2013, however other parallel ECC circuit designs may also be used without departing from the scope of the disclosure. In some embodiments, sequential ECC circuits or other ECC circuit architectures may be used to implement ECC circuit 545 without departing from the scope of the invention.

Referring back to FIG. 5, the peripheral circuits 510 may include a control circuit 560. The control circuit 560 may provide control signals to the write driver 525, the data sense amplifier 530, the ECC circuit 545, and/or the array 505. The control circuit 560 may also provide control signals to other components of the memory 500 that are not shown in FIG. 5. The control circuit 560 may include a clock that produces a clock signal. In some embodiments, the control circuit 560 may receive a clock signal from a separate clock in the memory (not shown in FIG. 5). The clock signal may be used by the control circuit 560 for triggering and/or timing of one or more memory operations. The control circuit 560 may control the column address strobe timing chain and/or other timing chains. The control circuit 560 may control the timing of operations, enablement of memory components, and/or other control functions. The control circuit 560 may be programmed to control the execution of pipelined write mask operations such as those that will be described in more detail below and illustrated in FIG. 3 and FIG. 4.

The detection and pipelining of consecutive write mask operations by the memory 500 may be implemented by the use of separate global read I/O 515 and global write I/O 520 as shown in FIG. 5. However, other I/O line configurations may be possible for implementing pipelining consecutive write mask operations.

Figure 6:
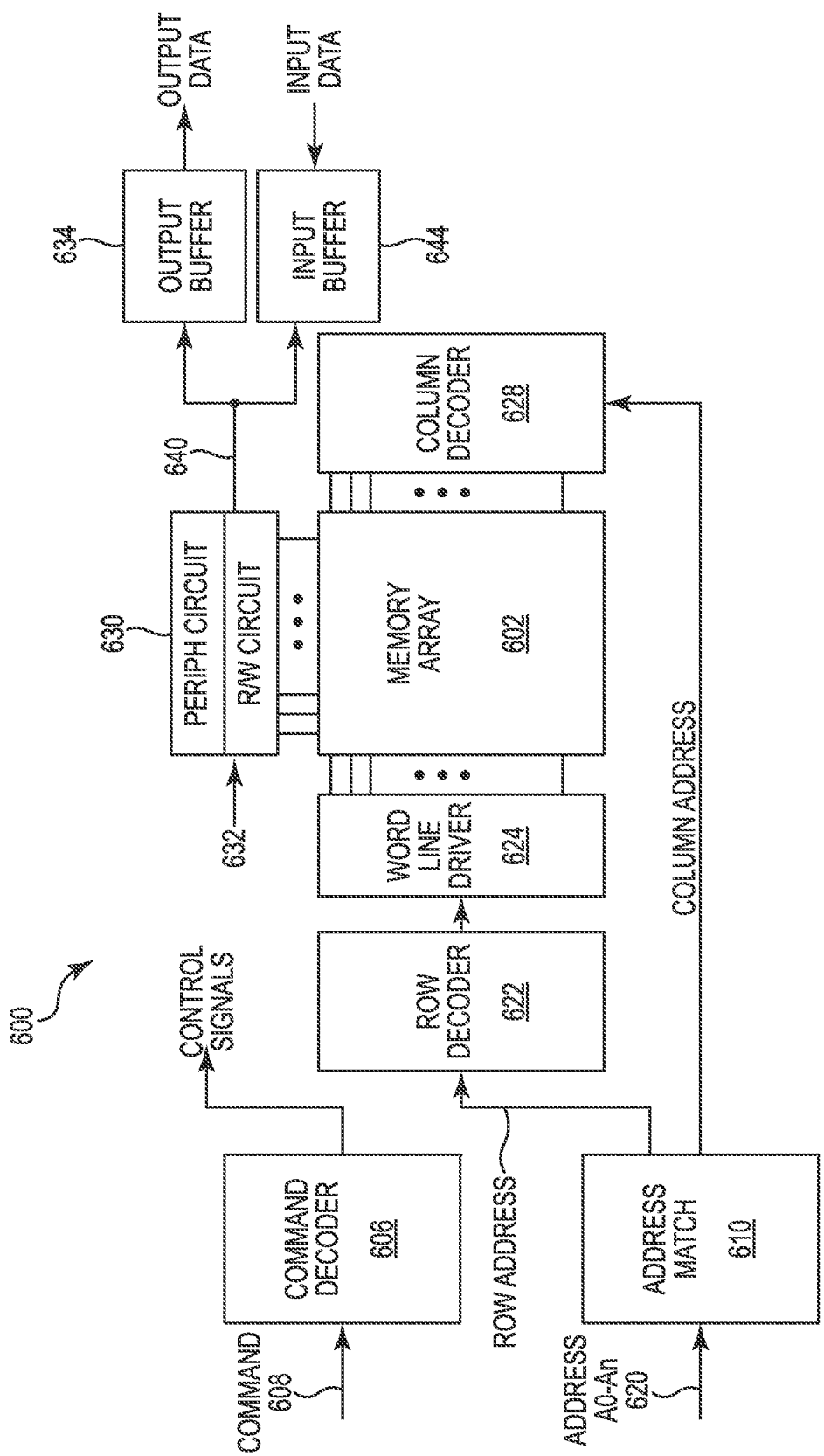
FIG. 6 is a block diagram of a portion of a memory according to an embodiment of the disclosure.

FIG. 6 illustrates a portion of a memory 600 including an embodiment of the present invention. The memory 600 includes an array 602 of memory cells, which may be, for example, volatile memory cells and/or non-volatile memory cells. The array 602 may include an array of memory cells according to an embodiment of the invention, for example, array 505 of FIG. 5. The memory 600 includes a command decoder 606 that receives memory commands through a command bus 608 and generates corresponding control signals within the memory 600 to carry out various memory operations. The command decoder 606 responds to memory commands applied to the command bus 608 to perform various operations on the array 602. In particular, the command decoder 606 is used to generate internal control signals to read data from and write data to the array 602.

Row and column address signals are applied to the memory 600 through an address bus 620 and provided to an address latch 610. The address latch then outputs a separate column address and a separate row address. The row and column addresses are provided by the address latch 610 to a row address decoder 622 and a column address decoder 628, respectively. The row address decoder 622 is connected to word line driver 624 that activates respective rows of memory cells in the array 602 corresponding to received row addresses. The column address decoder 628 selects bit lines extending through the array 602 corresponding to respective column addresses. The selected data line (e.g., a bit line or bit lines) corresponding to a received column address is coupled to a read/write circuit 630 to provide read data to a data output buffer 634 via an input-output data bus 640.

The selected data line may be coupled to the read/write circuit 632 through a sense amplifier, column select circuit, local input/output line, local read/write circuit, global read lines, and/or additional peripheral circuits 630 according to an embodiment of the invention. For example, the peripheral circuits 630 may be implemented as peripheral circuits 510 described in FIG. 5 and may be included near and/or integrated with the read/write circuit 632. In some embodiments, the peripheral circuits 630 included near or integrated with the read/write circuit 632 may receive control signals from command decoder 606. Control signals may include command signals for memory operations, for example, write-mask operations. Write data are applied to the array 602 through a data input buffer 644 and the array read/write circuit 632 and/or peripheral circuits 630. The write data may be applied to the array from the read/write circuit 632 and/or peripheral circuits 630 through global write lines, local read/write circuit, local input/output line, column select circuit, and sense amplifier, according to an embodiment of the invention.

Figure 3:
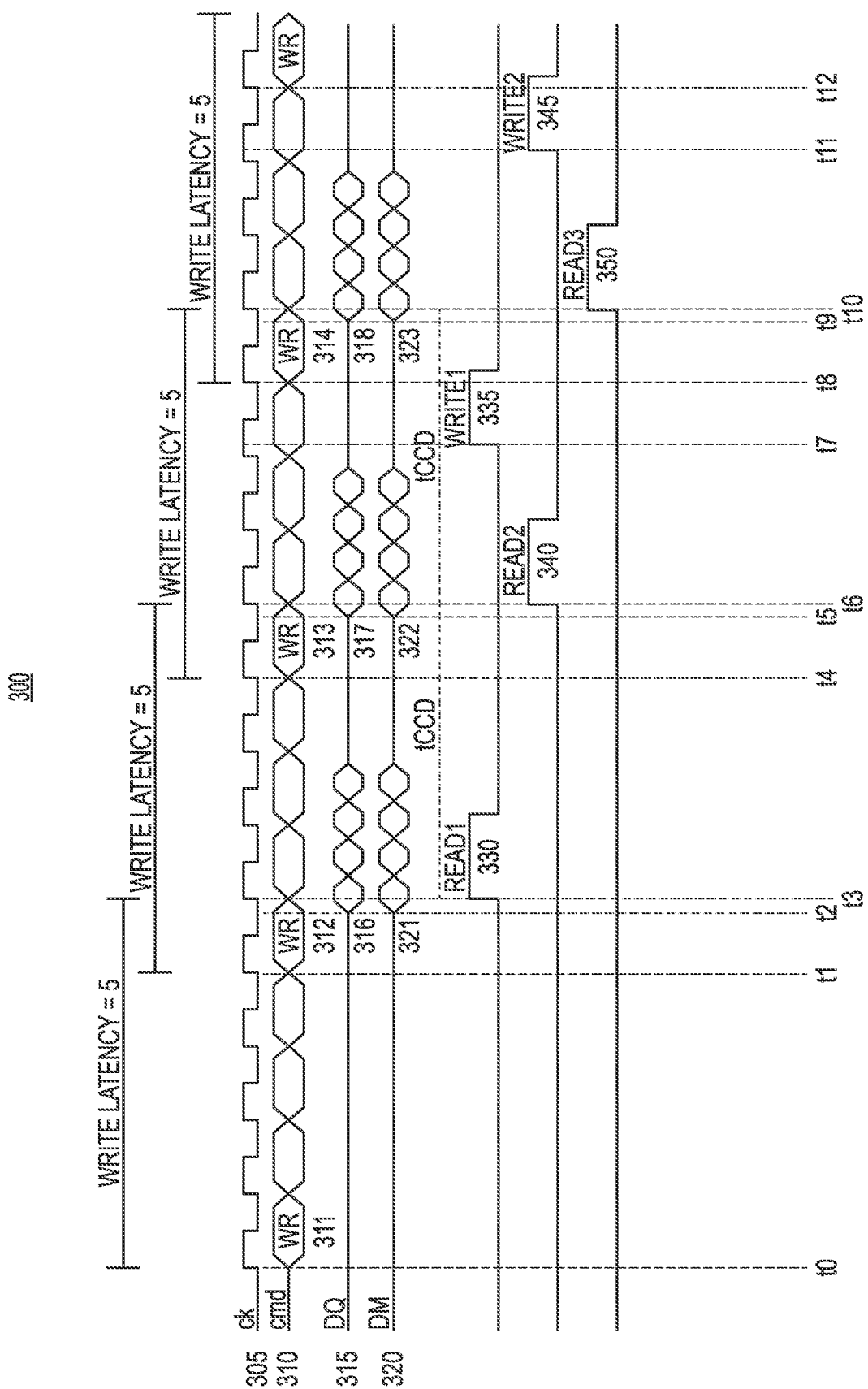
FIG. 3 is a timing diagram of two pipelined write mask operations according to an embodiment of the disclosure.

FIG. 3 illustrates a timing diagram 300 for implementing pipelined execution of operations according to an embodiment of the disclosure. A memory, for example, memory 500 illustrated in FIG. 5 or memory 600 illustrated in FIG. 6, may receive a clock signal 305 and a command signal 310. The clock signal 305 may provide triggering for one or more operations executed by the memory. The command signal 310 may indicate which operation is to be executed by the memory. The memory may further receive a data signal 315, which may include data to be written to an address. In some embodiments, the data signal 315 may be received via a global write data line, for example global write data line 555 illustrated in FIG. 5. The memory may also receive a mask data signal 320. The memory may receive other signals not shown in timing diagram 300. These may include an address signal, a chip enable signal, and/or other signals, for example.

Continuing in reference to FIG. 3, the memory of the present embodiment may have a write latency of five clock cycles. Other write latencies may be possible. At time t0, a command signal 310 indicating a first write command 311 may be received by the memory. At time t1, after five clock cycles, command signal 310 indicating a second write command 312 may be received by the memory. At time t2, which is five clock cycles after the first write command 311, the memory may receive a data signal 315 including first data 316 to be written to the array. The first data 316 may correspond to data to be written in response to the first write command 311 received at time t0. The memory may also receive a mask data signal 320 at time t2, which may indicate a write mask operation 321. Shortly after time t2, data at the memory location where the first data is to be written may be read by the memory at time t3. The read operation 330 may be triggered by the rising edge of the clock signal 305 at time t3. Once the data has been read, the ECC may be compared, errors corrected, and the first data 316 received at time t2 may be merged with the data read from the array, and new ECC calculated for the first data. In some embodiments, these operations may be performed by an ECC circuit, for example, ECC circuit 545 in FIG. 5. At time t4, a command signal 310 indicating a third write command 313 may be received by the memory. At time t5, the memory may receive a data signal 315 including second data 317 to be written to the array. The second data 317 may correspond to data to be written in response to the second write command 312 received at time t1. The memory may also receive a mask data signal 320 at time t5, which may indicate a write mask operation 322. Data at the memory location where the second data 317 is to be written may be read by the memory at time t6. The read operation 340 may be triggered by the rising clock signal 305. Once the data has been read, the ECC may be compared, errors corrected, and the new data received at time t5 may be merged with the data read from the array, and new ECC calculated for the second data 317. In some embodiments, these operations may be performed by an ECC circuit, for example, ECC circuit 545 in FIG. 5. At time t7, the memory may execute a write operation 335 to write the data corresponding to the first data 316 received at time t2 to the array. The corresponding ECC code may also be stored in the array, in another location in the memory, and/or outside the memory. The write operation 335 may be triggered by the end of the new ECC calculation for the first data 316. In some embodiments, the ECC calculation may be delay based.

At time t8, the memory may receive a command signal 310 indicating a fourth write operation 314. At time t9, the memory may receive a data signal 315 including the data 318 to be written to the array. The data 318 may correspond to data to be written in response to the third write command 313 received at time t4. The memory may also receive a mask data signal 320 at time t9, which may indicate a write mask operation 323. Data at the memory location where the third data 318 is to be written may be read by the memory at time t10. The read operation 350 may be triggered by the rising clock signal 305. Once the data has been read, the ECC may be compared, errors corrected, and the new data received at t9 may be merged with the data read from the array, and new ECC calculated for the third data 318. In some embodiments, these operations may be performed by an ECC circuit, for example, ECC circuit 545 in FIG. 5. At time t11, the memory may execute a second write operation 345 to write the data 317 corresponding to the data received at time t5 to the array. The corresponding ECC code may also be stored in the array, in another location in the memory, and/or outside the memory. The write operation 345 may be triggered by the end of the new ECC calculation for the second data 317. In some embodiments, the ECC calculation may be delay based. At time t12, a command signal 310 indicating a write command may be received by the memory. Although not shown in FIG. 3, read and write operations may be executed in response to the third, fourth, and fifth mask write commands received. Any number of consecutive write mask commands may be pipelined in the manner illustrated in the timing diagram 300 without departing from the principles of the disclosure.

Although each write mask operation takes longer than tCCD to execute, when two consecutive write mask operations are executed in the pipelined manner illustrated in FIG. 3, the two write mask operations are executed within 2×tCCD. It may be possible to trim the write timing to avoid conflicts with the read timing.

Figure 4:
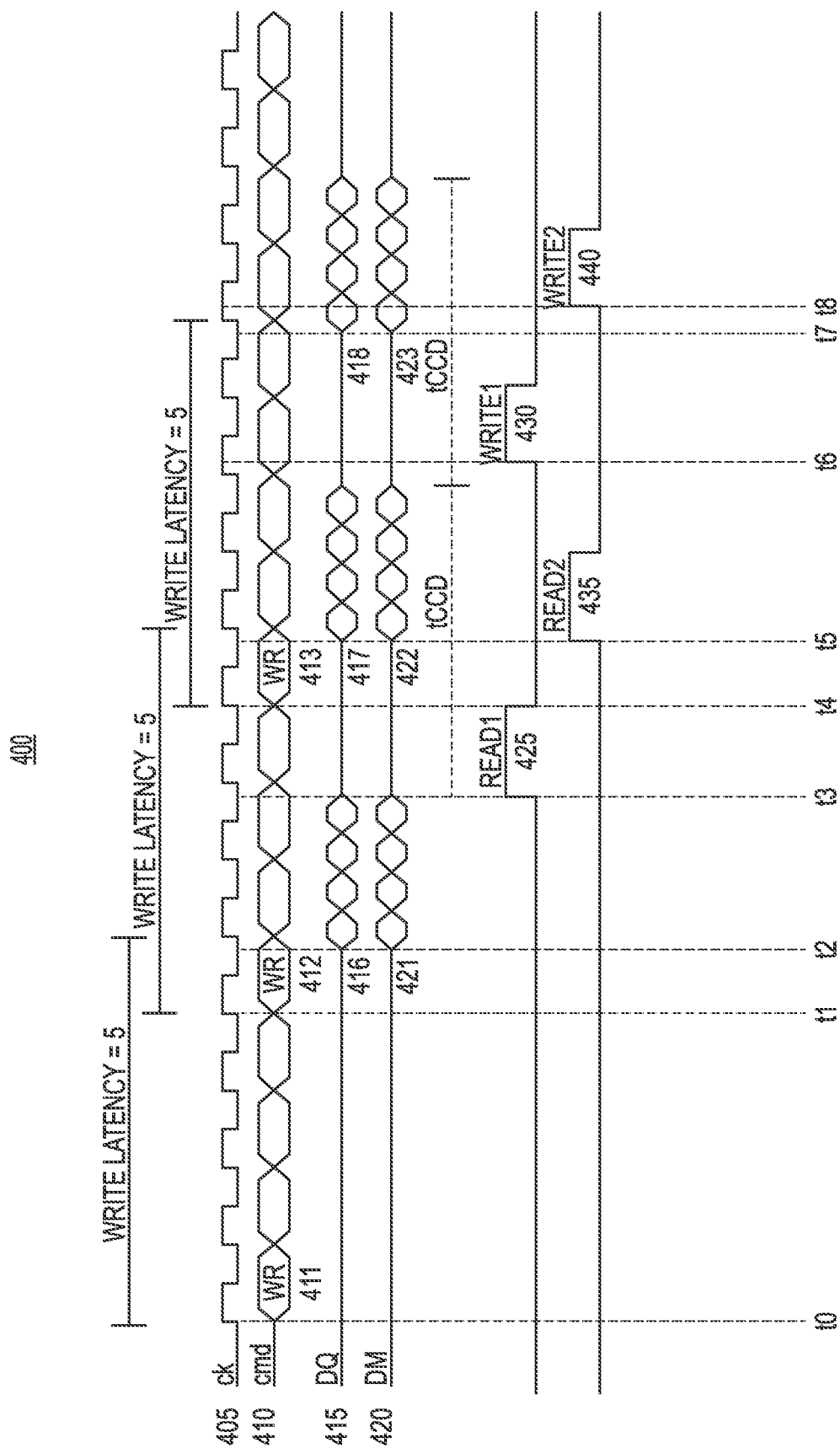
FIG. 4 is a timing diagram of two pipelined write mask operations according to an embodiment of the disclosure.

An embodiment according to the principles of the disclosure for implementing pipelined operations is illustrated in the timing diagram 400 in FIG. 4. In some embodiments, the pipelined operations illustrated in timing diagram 400 may be executed by a memory such as memory 500 or memory 600 illustrated in FIGS. 5 and 6, respectively. A memory may receive a clock signal 405 and a command signal 410. The clock signal 405 may provide triggering for one or more operations executed by the memory. The command signal 410 may indicate which operation is to be executed by the memory. The memory may further receive a data signal 415, which may include data to be written to an address. The memory may also receive a mask data signal 420. The memory may receive other signals not shown in timing diagram 400. These may include an address signal, a chip enable signal, and/or other signals, for example.

Continuing in reference to FIG. 4, the memory of the second exemplary embodiment may have a write latency of five clock cycles. Other write latencies may be possible. At time t0, a command signal 410 indicating a first write command 411 may be received by the memory. At time t1 a command signal 410 indicating a second write command 412 may be received by the memory. At time t2, which is five clock cycles after the first write command 411, the memory may receive a data signal 415 including the data 416 to be written to the array. The first data 416 may correspond to data to be written in response to the first write command 411 received at time t0. The memory may also receive a mask data signal 420 at time t2, which may indicate a write mask operation 421. After the data signal 415 has been received at time t3, the memory may begin a read operation 425 to read data at the memory location where the first data 416 is to be written. Following completion of the read operation 425 the ECC may be compared, errors corrected, and the first data 416 received at time t2 may be merged with the data read from the array, and new ECC calculated for the first data 416. In some embodiments, these operations may be performed by an ECC circuit, for example, ECC circuit 545 in FIG. 5. At time t4, the memory may receive a command signal 410 indicating a third write command 413. At time t5, the memory may begin a second read operation 435 to read data at the memory location where the second data 417 is to be written in response to the second write command 412 received at time t1. After the read operation 435 has completed, the ECC may be compared and errors corrected at the memory location where the second data is to be written. In some embodiments, these operations may be performed by an ECC circuit, for example, ECC circuit 545 in FIG. 5. Also at time t5, the memory may receive a data signal 415 including second data 417 to be written to the array. The data 417 may correspond to data to be written in response to the second write command 412 received at t1. The memory may also receive a mask data signal 420 at time t5, which may indicate a write mask operation 422. The second data 417 may be merged with the data read from the array and new ECC calculated for the second data 417. In some embodiments, these operations may be performed by an ECC circuit, for example, ECC circuit 545 in FIG. 5. At time t6, the memory may execute a write operation 430 to write the data corresponding to the first data 416 received at time t2 to the array. The corresponding ECC code may also be stored in the array. The corresponding ECC code may also be stored in another location in the memory, and/or outside the memory. At time t7, the memory may receive a data signal 415 including third data 418 to be written to the array. The data 418 may correspond to data to be written in response to the third write command 413 received at time t4. The memory may also receive a mask data signal 420 at time t4, which may indicate a write mask operation 423. Shortly thereafter at time t8, a second write operation 440 may be executed by the memory to write the data corresponding to the second data 417 received at time t5 to the array. The corresponding ECC code may also be stored in the array. The corresponding ECC code may also be stored in another location in the memory, and/or outside the memory. In some embodiments, the write operations may be executed, at least in part, by a write driver, for example, write driver 525 illustrated in FIG. 5.

Although not shown in FIG. 4, read and write operations may be executed in response to the third mask write command received. Any number of consecutive write mask commands may be pipelined in the manner illustrated in the timing diagram 400 without departing from the principles of the disclosure. Although each write mask operation takes longer than tCCD to execute, when two consecutive write mask operations are executed in the pipelined manner illustrated in FIG. 4, the two write mask operations are executed in less than 2×tCCD.

The read operations illustrated in FIG. 4 may be delay-based operations. In some embodiments, the first read operation and every subsequent odd read operation may be delay-based while the second read operation and every subsequent even read operation is triggered by the first read operation and subsequent odd read operations, respectively. The write operations may be triggered by the end of the new ECC calculation for the first data. In some embodiments, the ECC calculation may be delay based. In some embodiments, it may be possible to cancel the first read operation at time t3 and subsequent odd read operations when no mask data signal 420 is received at the same time as the data signal 415. In other words, the first read operation and subsequent odd read operations may not be executed when no mask data signal 420 is received. When no mask data signal 420 is received, the odd write commands may be executed as simple write commands by the memory. The second read operation and subsequent even read operations may occur even when no mask data signal 420 is received.

The timing requirements of the pipelined operations illustrated in timing diagram 400 may be less complex and power consumption may be less than the pipelined operations illustrated in timing diagram 300. The pipelined operations illustrated in timing diagram 300, however, may allow for write mask operations to be initiated sooner after the write command is received and tCCD may be less than the operations illustrated in timing diagram 400.

Although two exemplary implementations of the pipelining of operations illustrated in FIG. 2 have been described in detail in reference to FIGS. 3 and 4, other variations may be possible without departing from the scope of the principles of the disclosure. Furthermore, also the operations described in FIGS. 3 and 4 may be executed, at least in part by the memories 500 and 600 illustrated in FIGS. 5 and 6, other memories and architectures may be used to implement the pipelined execution of operations as illustrated in FIGS. 3 and 4.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
a first error correcting code (ECC) circuit coupled to a memory array and configured to:
receive first data and second data;
correct an error in the first data if detected to provide corrected first data, and if an error is not detected, provide the first data as the corrected first data; and
merge the corrected first data with the second data to provide merged data;
a second ECC circuit coupled to the memory array and configured to:
receive the first data and the second data;
merge the first data and the second data to provide initial merge data while the first ECC circuit is merging the corrected first, data with the second data; and
generate second parity data from the initial merge data; and
a write circuit coupled to the first and second ECC circuits and configured to output the merged data and the second parity data to the memory array.

2. The apparatus of claim 1, wherein the second ECC circuit further comprises a corrector circuit configured to correct one or more errors in the second parity data.

3. The apparatus of claim 1, wherein the first data is received from the memory array and the second data is received from an input buffer.

4. The apparatus of claim 1, wherein the first ECC circuit is further configured to receive a data mask from a control circuit and merge a first portion of the corrected first data with a second portion of the second data, wherein the first portion and the second portion are defined by the data mask.

5. The apparatus of claim 1, wherein the second ECC circuit is further configured to receive a data mask from a control circuit and merge a first portion of the first data with a second portion of the second data, wherein the first portion and the second portion are defined by the data mask.

6. An apparatus comprising:
- a first error correcting code (ECC) circuit coupled to a memory array and configured to receive first data from the array to perform a first operation comprising providing corrected data hits based at least on the first data;
- a second ECC circuit coupled to the memory array and configured to receive the first data from the array to perform a second operation comprising providing corrected parity bits based at least on the first data;
- wherein the first and second operations are performed in parallel.

7. The apparatus of claim 6 further comprising a write circuit coupled to the memory array and configured to output the corrected data bits and the corrected parity bits to the array.

8. The apparatus of claim 6, wherein the first ECC circuit is further configured to receive from the memory array parity hits associated with the first data and provide the corrected data bits based on the first data and the parity bits.

9. The apparatus of claim 8 wherein the second ECC circuit further configured to receive second data from an input buffer and provide the corrected part bits based on the first data and the second data.

10. The apparatus of claim 9, wherein the second ECC circuit is further configured to provide the corrected parity bits by:
- merging the first data and the second data via a data mask to provide an initial merge data; and
- using a corrector circuit to provide the corrected parity bits from the initial merge data.

11. The apparatus of claim 10, wherein the first ECC circuit is providing the corrected data bits while the second ECC circuit is providing the corrected parity bits.

* * * * *

UNITED STATES PATENT AND TRADEMARK OFFICE
CERTIFICATE OF CORRECTION

PATENT NO. : 11,955,991 B2
APPLICATION NO. : 17/723277
DATED : April 9, 2024
INVENTOR(S) : Wei Bing Shang et al.

Page 1 of 1

It is certified that error appears in the above-identified patent and that said Letters Patent is hereby corrected as shown below:

In the Claims

| Column | Line | Claim | Reads | Should Read |
|---|---|---|---|---|
| 13 | 10 | 6 | corrected data hits | corrected data bits |
| 14 | 3 | 8 | memory array parity hits | memory array parity bits |
| 14 | 6 | 9 | the second ECC circuit further configured to receive | the second ECC circuit is further configured to receive |
| 14 | 7 | 9 | corrected part bits | corrected parity bits |

Signed and Sealed this
Twenty-fifth Day of June, 2024

Katherine Kelly Vidal
*Director of the United States Patent and Trademark Office*